United States Patent [19]

Kondo

[11] Patent Number: 4,623,783
[45] Date of Patent: Nov. 18, 1986

[54] METHOD OF DISPLAYING DIFFRACTION PATTERN BY ELECTRON MICROSCOPE

[75] Inventor: Yukihito Kondo, Tokyo, Japan

[73] Assignee: Jeol Ltd., Tokyo, Japan

[21] Appl. No.: 743,015

[22] Filed: Jun. 10, 1985

[51] Int. Cl.$^4$ ............................................ H01J 37/26
[52] U.S. Cl. .................................... 250/310; 250/311; 250/396 R
[58] Field of Search .................... 250/311, 310, 396 R

[56] References Cited

U.S. PATENT DOCUMENTS 3,737,659  6/1973  Yanaka et al. ...................... 250/311
3,993,905  11/1976  Mollenstedt ........................ 250/311

OTHER PUBLICATIONS

*Journal of Electron Microscopy*, vol. 29, Nos. 1–4 (1980) pp. 408–412 and Table of Contents.

Primary Examiner—Carolyn E. Fields
Assistant Examiner—T. N. Grigsby
Attorney, Agent, or Firm—Webb, Burden, Robinson & Webb

[57] ABSTRACT

A method for large-angle convergent-beam diffraction comprises selecting a portion of the diffraction pattern formed by an objective lens, by the use of a diaphragm. Then, a portion of the electron micrograph which is formed by the electron beam passed through the diaphragm is detected, thus producing a signal. This enables a large-angle convergent-beam electron diffraction method that permits one to examine a specimen region which is much narrower than conventional.

4 Claims, 2 Drawing Figures

METHOD OF DISPLAYING DIFFRACTION PATTERN BY ELECTRON MICROSCOPE

DESCRIPTION

BACKGROUND OF THE INVENTION

The present invention relates to a method of displaying a diffraction pattern that can be derived from a microscopic area on a specimen, by an electron microscope.

Sometimes, electron microscopy employs large-angle convergent-beam electron diffraction to analyze a crystalline specimen. That is, such a specimen is scanned with an electron beam which falls on the specimen at varying incidence angle. The electron beam transmitted through the specimen without scattering is detected, and the resultant signal is supplied to a display means synchronized with said scan to display a diffraction pattern. In the conventional large-angle convergent-beam electron diffraction, a portion of an electron micrograph formed by an objective lens is allowed to pass through a diaphragm. Then, a portion of the diffraction pattern formed by the passed electron beam is detected to thereby produce a signal. The diffraction pattern obtained by this method shows a change in the intensity of an electron beam which has passed through a specimen without being scattered when the incidence angle at which the beam falls on the specimen is varied. The symmetry, point and space groups of a crystal can be effectively determined by analyzing this diffraction pattern. FIG. 1 shows one example of electron microscope for displaying such a diffraction pattern. This microscope includes a convergent (condenser) lens diaphragm (aperture plate) 1 and two stages of deflection coils 2 and 3. A specimen 4 is placed within an objective lens. Lenses (principal planes of the magnetic lens fields) produced before and behind the objective lens are indicated by reference numerals 5 and 6, respectively. The electron beam passed through the aperture formed in the diaphragm 1 is deflected by the deflection coils 2 and 3 and made parallel to the optical axis Z. Then it enters the lens 5 in front of the objective lens and is substantially collimated by the lens 5. Thereafter, it is further deflected and falls on a specific region on the specimen 4. Under this condition, the position at which the electron beam enters the front lens is varied, i.e., the beam is scanned across the front lens. As a result, the incidence angle of the beam upon the specimen 4 is varied, while the incidence position remains fixed. Disposed or produced at the rear of the rear lens 6 are a field of view-limiting diaphragm 7, a projector lens magnetic field 8, projector lens alignment coils 9, and a fluorescent screen 10.

In the structure described above, those portions of the electron beam falling on the specimen 4 which penetrated the specimen or were diffracted by the specimen are brought to focus by the magnetic lens 6 that is set up at the rear of the objective lens. Thus, an image of the specimen 4 is formed on the field of view-limiting diaphragm 7 that is disposed behind the lens 6. The diaphragm 7 acts to allow only a portion of the image of the specimen to pass through it and travel along the optical axis. Then, the projector lens field 8 projects the beam onto the fluorescent screen 10, so that a diffraction pattern is formed on it. This pattern is moved, since the incidence angle of the beam upon the specimen 4 is being changed. The projector lens alignment coils 9 are so adjusted that the diffraction pattern ceases to move, in spite of the changing incidence angle. The coils 9 receive signals that are synchronized with scanning signals applied to the deflection coils 2 and 3. The magnitude of the signals applied to the coils 9, the ratio of the magnitude of the Y scanning signal to the magnitude of the X scanning signal, and other factors are adjusted to attain the stoppage of the movement of the diffraction pattern. Subsequently, only the electron beam transmitted through the specimen 4, for example, is permitted to pass through the aperture 11 formed in the fluorescent screen 10, and then it is detected by a detector 12. The resultant signal is supplied as a luminance-modulating signal to a cathode-ray tube that is synchronized with the scanning signals applied to the coils 2 and 3, whereby a large-angle convergent-beam electron diffraction pattern is formed on the cathode-ray tube. This method of display is disclosed in "Journal of Electron Microscopy" Vol. 29, No. 4, 408–412, 1980.

The diffraction pattern obtained by the above-described method is derived from the beam that comes from a specimen region restricted by the diaphragm 7. Since the magnification of the specimen image focused on the diaphragm 7 is of the order of several tens, the restricted region is relatively broad. Even if the diameter of the aperture in the diaphragm 7 is as small as microns, the obtained diffraction pattern corresponds to a relatively broad area having a diameter of 0.5 $\mu$m or more.

SUMMARY OF THE INVENTION

In view of the foregoing, it is an object of the present invention to provide a method capable of representing a microscopic region on a specimen as a large-angle convergent-beam electron diffraction pattern.

The method of displaying a diffraction pattern by an electron microscope according to the invention comprises the steps of: (A) scanning a specimen with an electron beam in such a way that the incidence angle of the beam upon the specimen is changed while the point at which the beam falls upon the specimen remains fixed; (B) bringing a diffraction pattern to focus on a certain plane by means of an auxiliary lens, the diffraction pattern being formed on the focal plane at the back of an objective lens; (C) projecting the focused diffraction pattern to a large scale; (D) stopping the movement of the diffraction pattern that has been caused by the changing incidence angle of the beam; (E) extracting only a portion of the diffraction pattern focused on the certain plane; (F) detecting an electron beam which constitutes the extracted portion of the projected diffraction pattern; and (G) displaying the resulting signal corresponding to the scanning of the specimen.

The above and other objects of the invention will become more readily apparent from the ensuing specification and claims when taken with the drawings.

PREFERRED EMBODIMENT OF THE INVENTION

Figure 1:
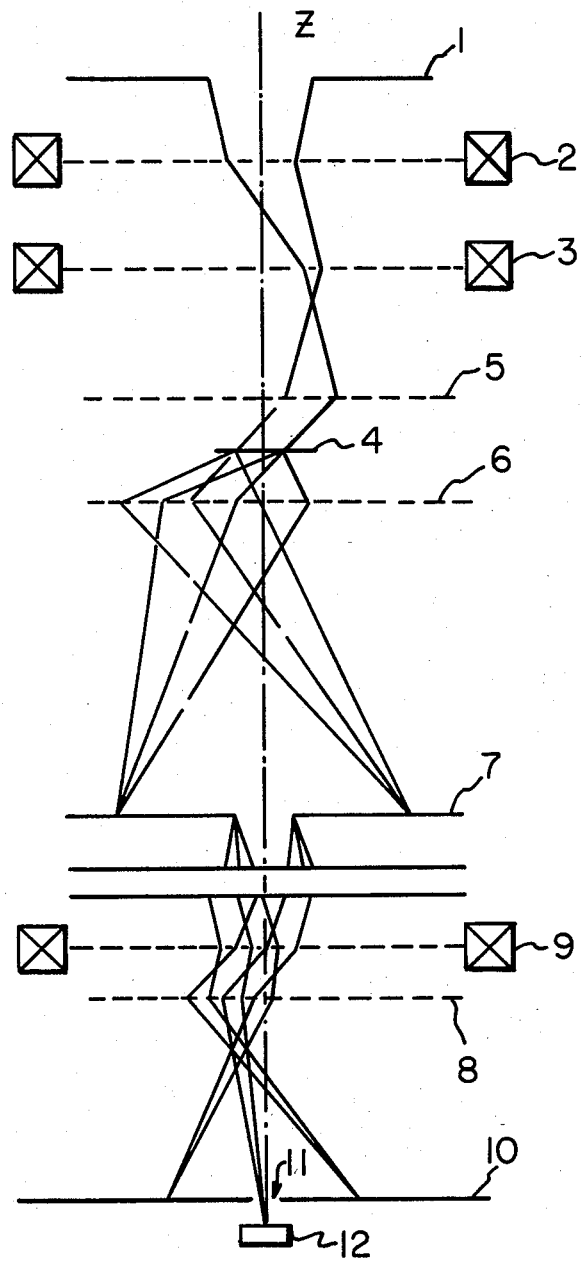
FIG. 1 is a schematic diagram of an electron microscope for carrying out a conventional method of displaying diffraction pattern.
Figure 2:
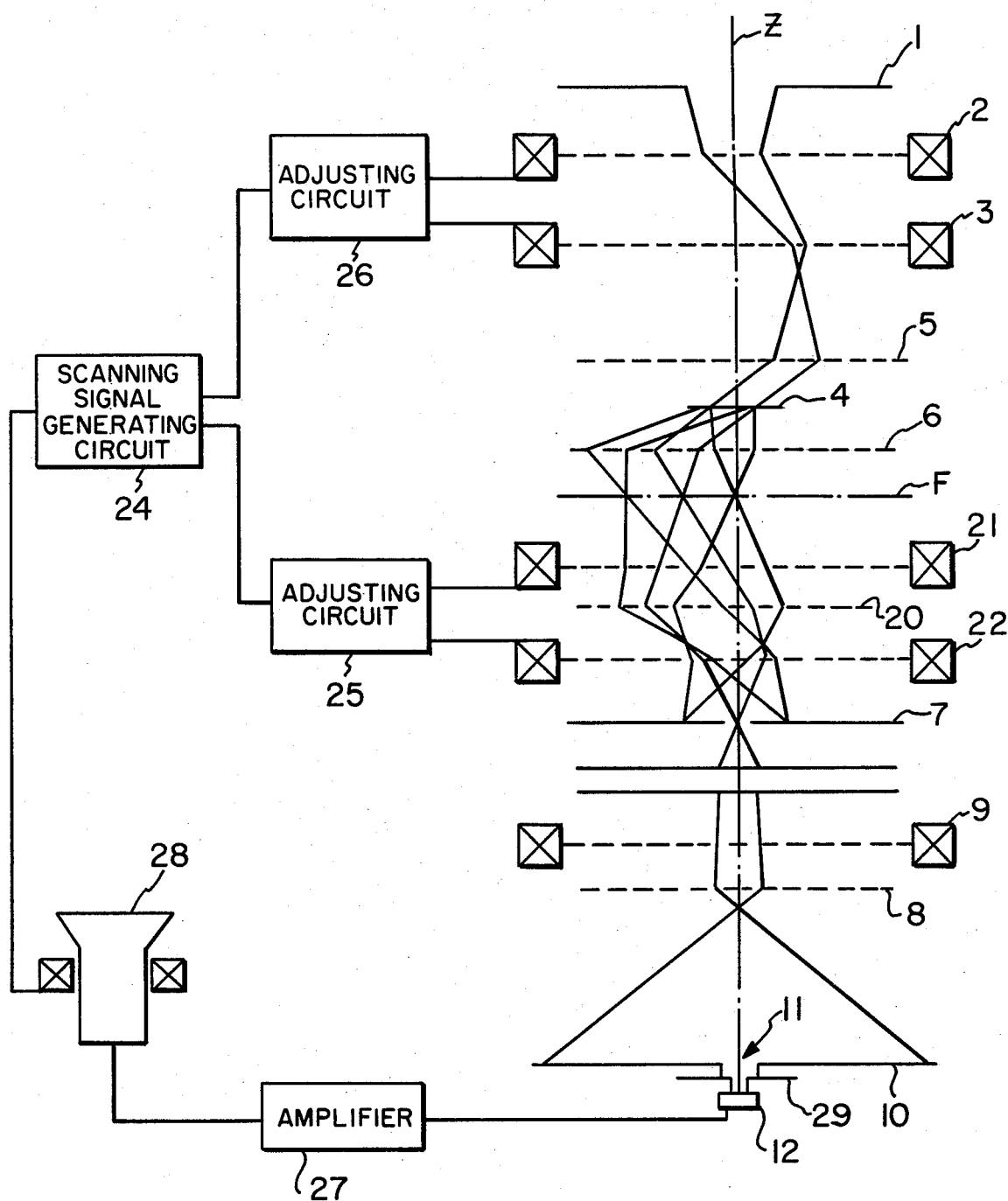
FIG. 2 is a schematic diagram of an electron microscope for carrying out the method of displaying a diffraction pattern according to the present invention.

Referring to FIG. 2, there is shown an electron microscope for carrying out the method according to the invention. It is to be noted that those components which are the same as in FIG. 1 are indicated by the same reference numerals as in FIG. 1 and will not be hereinafter described in detail. The microscope has an auxiliary lens magnetic field 20 and deflection coils 21, 22 between the objective lens magnetic field 6 and the field of view-limiting diaphragm 7, for embodying the method. Although the coils 21 and 22 may also be used to move the field of view of an electron micrograph as disclosed in U.S. Pat. No. 3,737,659, the deflection coils 21 and 22 of the instrument shown in FIG. 2 receive a scanning signal from a scanning signal generating circuit 24 via an adjustment circuit 25. The scanning signal from the circuit 24 is also supplied via another adjustment circuit 26 to the deflecting coils 2 and 3 that are in the stage preceding the objective lens. Consequently, the deflection coils 2, 3, 21, 22 receive the synchronized scanning signals. The scanning signal from the signal generating circuit 24 is also applied to a cathode-ray tube 28 for the scanning of this tube, which is supplied with the output signal from the detector 12 via an amplifier 27.

In the novel structure described above, the electron beam transmitted through the convergent lens diaphragm 1 is made parallel to the optical axis by the deflecting coils 2 and 3 and directed to the magnetic field 5 preceding the objective lens in the same way as the method already described in connection with FIG. 1. Then, the beam is collimated by the front lens 5, and is caused to fall on a desired portion of the specimen 4 that lies on the optical axis. The scanning signal from the signal generating circuit 24 is applied to the two stages of deflection coils 2 and 3 to move the incidence point of the beam upon the front lens 5. Although the incidence point moves, the beam is always kept parallel to the optical axis and enters the lens 5. Therefore, the position at which the electron beam falls on the specimen 4 remains stationary, whereas the incidence angle is varied.

After passing through the specimen and diffracting, the electron beam is brought to focus by the magnetic field 6 produced behind the objective lens, and a diffraction pattern is formed on the focal plane F at the back of the lens 6. The beam converged by the lens 6 is further converged by the auxiliary lens magnetic field 20. The intensity of the field 20 is so determined that the diffraction pattern formed on the back focal plane F comes to focus on the plane where the diaphragm 7 is disposed. Then, this diffraction pattern is projected onto the fluorescent screen 10 at a larger scale by the magnetic field 8.

In the first stage of this formation of the diffraction pattern, the diaphragm 7 is kept apart from the optical axis of the beam. Thus, the diffraction pattern formed on the plane where the diaphragm 7 is disposed is totally projected onto the fluorescent screen 10. At this time, the specimen 4 is scanned with the beam at changing incidence angle and so that pattern is moved. Then, the electron beam is deflected by the deflection coils 21 and 22 in such a way that the movement of the pattern stops in spite of the varying incidence angle, and that the beam transmitted through the specimen 4 travels parallel to the optical axis before entering the plane mentioned above. The deflection current supplied to the deflection coils 21 and 22 is based on the scanning signal from the scanning signal generating circuit 24. The magnitude of this scanning signal, the ratio of the intensity of the Y scanning signal to the magnitude of the X scanning signal, and other factors are adjusted by the adjustment circuit 25. The ratio of the magnitude of one of the scanning signals supplied to the deflection coils 21 and 22 to the magnitude of the other depends on the degree to which the auxiliary lens magnetic field 20 produced between these two coils angularly deflects the electron beam. Thus, if the field 20 is provided before or behind the two stages of deflection coils, then the obtained image will not be angularly deviated. In addition, the deflection current supplied to the coils 21 and 22 can be controlled simply by appropriately adjusting the movement of the pattern and controlling the position of the transmitted beam.

Subsequently, the diaphragm 7 is placed across the optical axis. Then, the aperture in the diaphragm 7 allows only the beam transmitted through the specimen to pass though it. Thereafter, the beam is projected onto the fluorecent screen 10 to a large scale by the projector lens magnetic field 8. A portion of the image of the projected beam then passes through the aperture 11 formed in the fluorescent screen 10, and the magnitude is limited by a movable diaphragm 29. Finally, the beam is detected by the detector 12. The resultant signal is amplified by the amplifier 27 and supplied as a luminance-modulating signal to the cathode-ray tube 28 that is synchronized to the scanning of the specimen. As a result, a large-angle convergent-beam electron diffraction pattern derived from a microscopic region on the specimen 4 is displayed on the screen of the cathode-ray tube.

In the above example, it is effective to correct the movement of the image due to the spherical aberration of the objective lens, by means of the projector lens alignment coils 9. In this case, the distance A that the image moves on the fluorescent screen due to the spherical aberration of the objective lens is given by $$A = C_s \cdot \alpha^3 \cdot M$$

where $C_s$ is the spherical aberration, $\alpha$ is the incidence angle of the electron beam upon the specimen, and M is the magnification of the specimen on the fluorescent screen. Accordingly, the current applied to the alignment coils 9 should be controlled by taking account of both the distance A given by the specimen, the distance A depending on the incidence angle of the beam and magnification.

It should also be understood that the foregoing description is a preferred embodiment of the disclosed electron microscope and that various changes and modifications may be made. For example, the structure for scanning the specimen with the electron beam at changing incidence angle is not limited to the combination of the two stages of deflection coils and the objective lens magnetic field. A simple combination of two stages of deflection coils may suffice.

As can be understood from the description thus far made, the present invention permits a diffraction pattern of a specimen to be imaged onto a field of view-limiting diaphragm. A portion of the focused image is projected to a larger scale, and a portion of the projected beam is detected and displayed on a cathode-ray tube synchronized to a scan which is made of the specimen using an electron beam falling on the specimen at changing incidence angle. Therefore, by setting the magnification of a value of tens of thousands, a diffraction pattern from a specimen region having a diameter of less than 0.02 μm can be displayed.

I claim:

1. A method of displaying a diffraction pattern by an electron microscope, comprising the steps of:
   (A) scanning a specimen with an electron beam in such a way that the incidence angle of the beam upon the specimen is change while the point at which the beam falls upon the specimen remains fixed;
   (B) bringing a diffraction pattern to focus on a certain plane by means of an auxiliary lens, the diffraction pattern being formed on the focal plane at the back of an objective lens;
   (C) projecting the focused diffraction pattern to a large scale;
   (D) stopping the movement of the diffraction pattern that has been caused by the changing incidence angle of the beam;
   (E) extracting only a portion of the diffraction pattern focused on the certain plane;
   (F) detecting an electron beam which constitutes the extracted portion of the projected diffraction pattern; and
   (G) displaying the resulting signal corresponding to the scanning of the specimen.

2. A method according to claim 1, wherein said step (A) is carried out by utilizing the deflecting action of two stages of deflecting coils and a magnetic field produced in front of or above the objective lens.

3. A method according to claim 1, wherein said step (D) is carried out by providing two stages of deflecting coils below the objective lens, the coils being supplied with signals synchronized to the scan made at step (A).

4. A method according to claim 3, wherein said step (E) is carried out by applying signals synchronized with the scan made at step (A) and a signal for selecting a diffraction pattern to be detected to said two stages of deflection coils disposed below the objective lens, those signals which are applied to the two stages of deflection coils bearing a superimposed relationship to each other.

* * * * *

UNITED STATES PATENT AND TRADEMARK OFFICE
CERTIFICATE OF CORRECTION

PATENT NO. : 4,623,783
DATED : November 18, 1986
INVENTOR(S) : Yukihito Kondo

It is certified that error appears in the above-identified patent and that said Letters Patent is hereby corrected as shown below:

After the line listing the filing date insert the following:

--Foreign Application Priority Data

June 15, 1984    Japan    59-123398--.

Column 2 Line 48 "large" should read --larger--.

Column 3 Line 62 "that" should read --the--.

Column 4 Line 21 "though" should read --through--.

Column 4 Line 22 "large" should read --larger--.

Column 4 Line 47 "current" should read --currents--.

Signed and Sealed this

Twenty-fourth Day of March, 1987

*Attest:*

DONALD J. QUIGG

*Attesting Officer*    Commissioner of Patents and Trademarks